(12) United States Patent
Rana et al.

(10) Patent No.: US 11,908,528 B2
(45) Date of Patent: Feb. 20, 2024

(54) SELECTIVELY CONFIGURABLE CHARGE PUMP

(71) Applicant: STMICROELECTRONICS INTERNATIONAL N.V., Geneva (CH)

(72) Inventors: Vikas Rana, Noida (IN); Arpit Vijayvergia, Bhopal (IN)

(73) Assignee: STMicroelectronics International N.V., Geneva (CH)

( * ) Notice: Subject to any disclaimer, the term of this patent is extended or adjusted under 35 U.S.C. 154(b) by 60 days.

(21) Appl. No.: 17/527,031

(22) Filed: Nov. 15, 2021

(65) Prior Publication Data

US 2022/0165339 A1 May 26, 2022

Related U.S. Application Data

(60) Provisional application No. 63/116,463, filed on Nov. 20, 2020.

(51) Int. Cl.
*G11C 16/30* (2006.01)
*H02M 3/07* (2006.01)
*G11C 5/14* (2006.01)

(52) U.S. Cl.
CPC ............. *G11C 16/30* (2013.01); *G11C 5/145* (2013.01); *H02M 3/077* (2021.05)

(58) Field of Classification Search
CPC ......... G11C 16/30; G11C 16/10; G11C 16/26; G11C 5/145; G11C 29/12005; G11C 11/4074; G11C 11/413; H02M 3/077; H02M 3/075; H02M 3/073
See application file for complete search history.

(56) References Cited

U.S. PATENT DOCUMENTS

| | | | |
|---|---|---|---|
| 7,221,610 B2 | 5/2007 | Yamazoe et al. | |
| 7,956,673 B2 | 6/2011 | Pan | |
| 8,514,628 B2 | 8/2013 | Nguyen et al. | |
| 8,699,247 B2 | 4/2014 | Nguyen et al. | |
| 2001/0048338 A1* | 12/2001 | Sato | H02M 3/073 327/390 |
| 2006/0140003 A1* | 6/2006 | Yamazoe | G11C 16/14 365/185.18 |
| 2010/0033232 A1* | 2/2010 | Pan | H02M 3/07 327/536 |
| 2020/0111513 A1* | 4/2020 | Baek | G11C 29/12005 |

\* cited by examiner

*Primary Examiner* — Jay W. Radke
(74) *Attorney, Agent, or Firm* — Seed IP Law Group LLP

(57) ABSTRACT

An integrated circuit includes a charge pump. The charge pump includes a plurality of charge pump stages and a plurality of switches. The switches can operated to selectively couple the charge pump stages in various arrangements of series and parallel connections based on a currently selected operational mode of the charge pump. The charge pump assists in performing read and write operations for a memory array of the integrated circuit.

19 Claims, 13 Drawing Sheets

| A | B | $\overline{A}$ | A+B | $\overline{A+B}$ | A⊕B | $\overline{A⊕B}$ | IMPLEMENTATION | PURPOSE |
|---|---|---|---|---|---|---|---|---|
| 0 | 0 | 1 | 0 | 1 | 0 | 1 | 8 STAGES IN SERIES | HIGH VOLTAGE LOW CURRENT |
| 0 | 1 | 1 | 1 | 0 | 1 | 0 | 4 STAGES TWICE IN PARALLEL | MID VOLTAGE MID CURRENT |
| 1 | 0 | 0 | 1 | 0 | 1 | 0 | 2 STAGES 4x IN PARALLEL | LOW VOLTAGE HIGH CURRENT |

SELECTIVELY CONFIGURABLE CHARGE PUMP

BACKGROUND

Technical Field

The present disclosure relates to the field of integrated circuits, more particularly to integrated circuits including charge pumps and memory arrays.

Description of the Related Art

Integrated circuits often include memory arrays. In order to generate voltages for various memory operations, many integrated circuits include multiple charge pumps. Each charge pump generates a particular voltage for a particular type of memory operation.

BRIEF SUMMARY

The present disclosure is directed to an integrated circuit that includes a memory. The integrated circuit includes a single charge pump for generating voltages for various operations related to the memory. The memory operations can include read operations, programming operations, and test operations. Each of these operations may call for a different voltage. The charge pump can be selectively operated to generate the appropriate voltage for each memory operation.

The charge pump includes multiple charge pump stages. The charge pump includes a plurality of switches that can each be selectively activated and deactivated to arrange the charge pump stages in various series and parallel connections. When a memory operation is to be performed, a mode selection code causes the switches to couple the charge pump stages in a configuration to generate the appropriate voltage for the memory operation. For example, a programming operation may cause the switches to couple all of the charge pump stages in series to generate a high voltage suitable for programming operations. A read operation may cause the switches to couple the charge pump stages in multiple parallel groups to generate a relatively low voltage suitable for read operations. In this way, a single charge pump can be utilized to generate multiple different voltages suitable for various read operations.

BRIEF DESCRIPTION OF THE SEVERAL VIEWS OF THE DRAWINGS

For a better understanding of the embodiments, reference will now be made by way of example to the accompanying drawings. In the drawings, identical reference numbers identify similar elements or acts. The sizes and relative positions of elements in the drawings are not necessarily drawn to scale. For example, some of these elements may be enlarged and positioned to improve drawing legibility.

DETAILED DESCRIPTION

Figure 1:
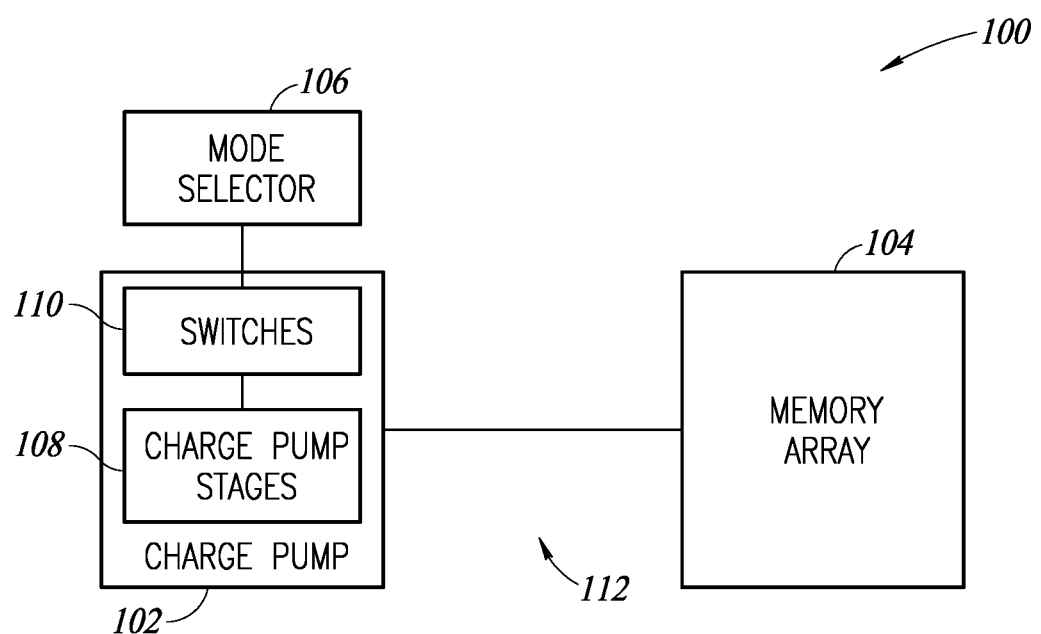
FIG. 1 is a block diagram of an integrated circuit, according to one embodiment.

FIG. 1 is a block diagram of an integrated circuit 100, according to one embodiment. The integrated circuit 100 includes a charge pump 102, a memory array 104, and a mode selector 106. The charge pump 102, the memory array 104, and the mode selector 106 cooperate to perform operations related to the memory array 104.

The memory array 104 includes a plurality of memory cells. The plurality of memory cells store data. The memory array 104 can include an electrically erasable and programmable read-only memory (EEPROM), such as a flash memory. While various examples may be described herein related to an EEPROM, the memory array 104 can include other types of memory without departing from the scope of the present disclosure. For example, the memory array 104 can include static random access memory (SRAM), dynamic random access memory (DRAM), or other types of memory.

The integrated circuit 100 can perform various operations related to the memory array 104. These operations can include read operations, programming operations, and testing operations. A read operation of the memory array 104 reads the data stored by one or more selected memory cells of the memory array 104. A read operation can include supplying voltages to word lines, bit lines, and gates of transistors that are coupled to the word lines and bit lines. The read operation can also include supplying voltages to sense amplifiers or other circuitry associated with the memory array 104. Typically, a read operation utilizes a relatively low voltage and relatively large amounts of current.

A programming operation of the memory array 104 includes changing the data stored in one or more selected memory cells of the memory array 104. The programming operation can include writing data to the selected memory cells or erasing data from the selected memory cells or from blocks of memory cells of the memory array 104. In the example of an EEPROM, a programming operation may utilize relatively high voltages and low amounts of current compared to the read operations. This is because EEPROMs typically store data in floating gates of memory cell transistors. Writing or erasing data from the floating gate is performed by applying a relatively high voltage between terminals of the memory cell transistor causing a current to flow through the transistor. The high-voltage results in Fowler-Nordheim tunneling between the floating gate and the channel of the memory cell transistor. In Fowler-Nordheim tunneling, electrons either tunnel from the channel into the floating gate or from the floating gate into the channel. This can be accomplished with a relatively high voltage and relatively small current.

Traditional integrated circuits utilize multiple charged pumps to generate the various voltages utilized in read and programming operations of memory cells. A first charge pump is utilized to generate a relatively low voltages and high currents for read operations. A second charge pump is utilized to generate relatively high voltages and low currents for programming operations. The multiple charge pumps take up valuable area of the integrated circuit.

Advantageously, the integrated circuit 100 utilizes the single charge pump 102 to generate voltages for both read operations and programming operations of the memory array 104. The charge pump 102 can be selectively configured to generate read voltages, programming voltages, and test voltages. The single charge pump 102 takes up less area than is consumed by the multiple charge pumps of traditional integrated circuits.

The charge pump 102 includes a plurality of charge pump stages 108. Each charge pump stage 108 receives an input voltage and generates an output voltage that is higher than the input voltage. In one example, each charge pump stage 108 receives an input voltage and a supply voltage VDD. The charge pump stage 108 generates an output voltage corresponding to the sum of the input voltage and the supply voltage. If two charge pump stages are coupled in series such that the output voltage of the first charge pump stage is provided as the input voltage to the second charge pump stage, then the result is that the output voltage of the second charge pump stage corresponds to the input voltage of the first charge pump stage plus twice the supply voltage VDD because each charge pump stage adds VDD to its input voltage. By coupling two charge pump stages in parallel, the total output voltage is the same as the output of each individual charge pump stage. However, as each charge pump stage can provide only a finite current, coupling two charge pump stages in parallel doubles the amount of current that can be provided. The charge pump 102 utilizes these principles to selectively generate voltages appropriate for read operations, programming operations, and test operations of the memory array 104.

The charge pump 102 includes switches 110. The switches 110 are coupled between the various charge pump stages 108. The switches 110 can be selectively controlled to couple the charge pump stages 108 in various series and parallel configurations. For example, by selectively opening and closing the switches 110, the charge pump stages 108 can be electrically coupled in the various series and parallel configurations. These various series and parallel configurations can provide output voltages from the charge pump 102 tailored to a currently selected operational mode.

If a read operation is to be performed in relation to the memory array 104, then the charge pump 102 is placed in a read operational mode. In the read operational mode, the switches 110 are selectively activated to couple charge pump stages 108 in parallel with each other such that a relatively low voltage is provided with a relatively high possible current output. The read operational mode can include coupling the charge pump stages 108 into multiple parallel groups of series coupled charge pump stages 108. Each parallel group includes a same number of charge pump stages 108 coupled in series. Thus, each parallel group of charge pump stages 108 receives a same input voltage and provides a same relatively low output voltage. The relatively low-voltage is provided to the memory array 104, or to read circuitry associated with the memory array 104.

If a programming operation is to be performed in relation to the memory array 104, the charge pump 102 is placed in a programming operational mode. In the programming operational mode, the switches 110 are selectively activated to couple all of the charge pump stages 108 in series. The series coupling of all the charge pump stages results in a relatively high output voltage. This is because each charge pump stage receives as its input voltage, the output voltage from the previous charge pump stage and provides an output voltage that is the sum of the output voltage of the previous stage and the supply voltage. The larger the chain of series coupled charge pump stages 108, the higher the output voltage. However, the entire chain of series coupled charge pump stages can still only provide the maximum current corresponding to the maximum current that a single charge pump stage can supply. The relatively high voltage is provided to the memory array 104 to program selected memory cells or blocks of memory cells in the memory array 104 via Fowler-Nordheim tunneling, in the example of floating gate memory cells.

In one embodiment, all of the charge pump stages 108 are used in each operational mode of the charge pump 102. Accordingly, the charge pump 102 can include a number of charge pump stages 108 sufficient to provide the programming voltage when all are coupled in series. The same number of charge pump stages can be coupled in parallel groups of series coupled charge pump stages 108 to provide the read voltage. Accordingly, a single charge pump stage 102 is utilized to provide both read voltages and programming voltages. This can save a large amount of integrated circuit area over traditional charge pumps.

In one embodiment, the charge pump 102 can be placed in a test operational mode. In the test operational mode, the charge pump 102 outputs a voltage that is between the read voltage and the programming voltage. The maximum possible current in the test operational mode is between the maximum operational currents of the read and programming modes. This is accomplished by selectively activating the switches 110 to couple the charge pump stages 108 in parallel groups of series coupled charge pump stages. The number of parallel groups in the test operational mode is lower than the number of parallel groups in the read operational mode. The number of series coupled charge pump stages 108 in each group is higher than in the read operational mode. The result is a higher total output voltage than the read operational mode with a lower maximum current than the read operational mode. The charge pump 102 can utilize all of the charge pump stages 108 in each operational mode.

The mode selector 106 controls the operational mode of the charge pump 102. The mode selector 106 outputs a selection code corresponding to the selected operational mode. The selection code causes the switches 110 to be selectively activated to place the charge pump stages 108 in the coupling scheme corresponding to the selected operational mode.

In one embodiment, the mode selector 106 generates switch control signals based on the selection code. In this case, the mode selector 106 can include a logic circuit. When the selection code is provided to the logic circuit, the logic circuit generates switch control signals to be provided to each of the switches 110 in order to selectively activate and deactivate the various switches 110 the place the charge pump stages 108 in the appropriate coupling scheme.

Figure 2:
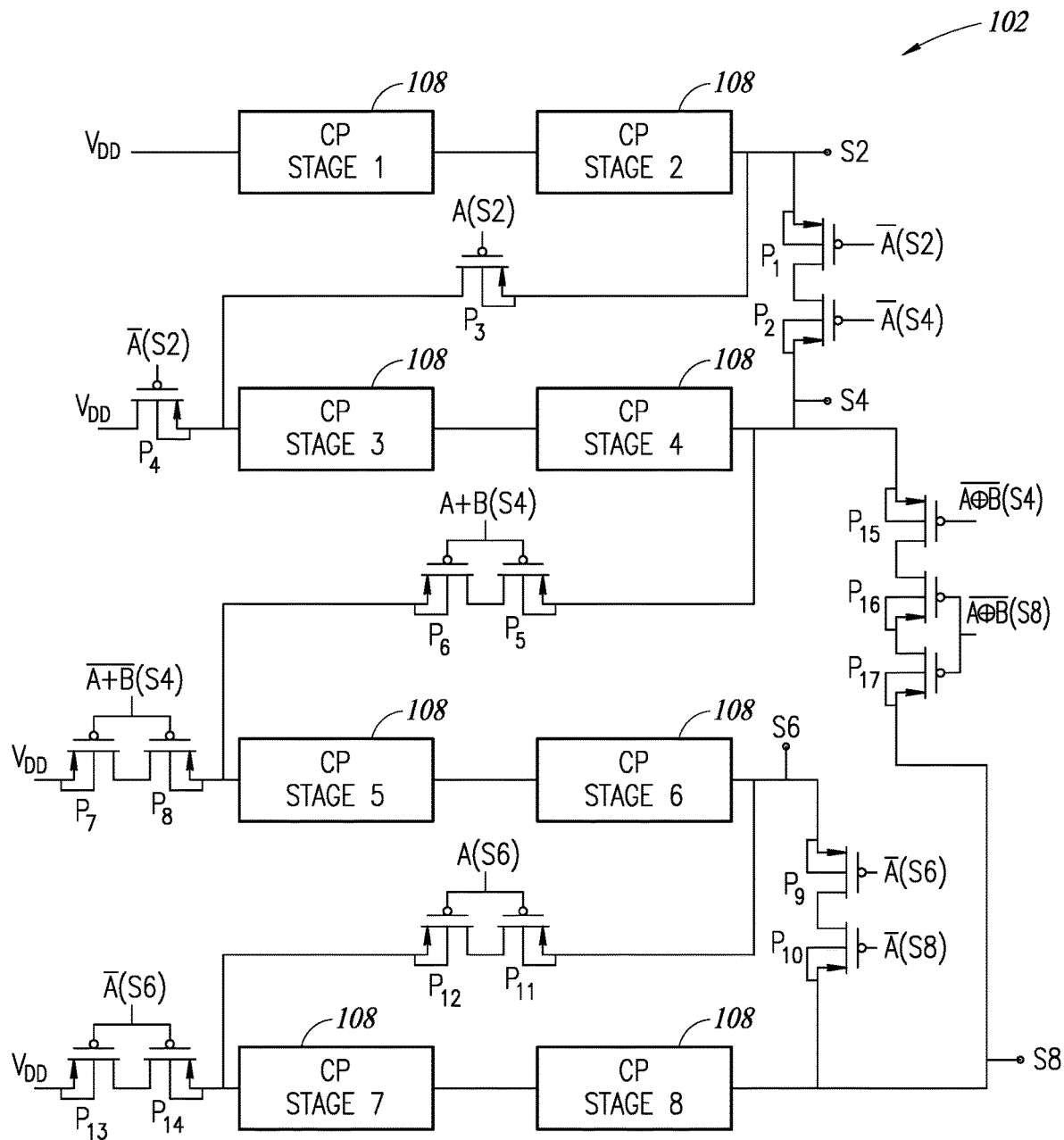
FIG. 2 is a schematic diagram of a charge pump, according to one embodiment.

FIG. 2 is a schematic diagram of a charge pump 102, according to one embodiment. The charge pump 102 includes eight charge pump stages 108. The charge pump 102 also includes a plurality of P-type metal-oxide-semiconductor (PMOS) transistors P1-P14. The PMOS transistors P1-P14 are examples of the switches 110 described in relation to FIG. 1. The charge pump 102 can include different numbers and configurations of charge pump stages 108 and switches 110 without departing from the scope of the present disclosure.

In the example of FIG. 2, the charge pump stages 108 are hardwired in four groups of two series coupled charge pump stages. For example, charge pump stages one and two are coupled in series with each other, charge pump stages three and four are coupled in series with each other, charge pump stages five and six are coupled in series with each other, and charge pump stages seven and eight are coupled in series of each other.

As described herein, each charge pump stage 108 receives an input voltage and provides an output voltage. In one example, each charge pump stage adds the supply voltage VDD to its input voltage. If a charge pump stage receives the supply voltage as its input voltage, then that charge pump stage will output double the supply voltage. If a charge pump stage receives twice the supply voltage as its input voltage, then the charge pump stage will output three times the supply voltage as its output voltage.

The first charge pump stage receives the supply voltage VDD as the input voltage and provides an output voltage. The second charge pump stage receives as the input voltage, the output voltage of the first charge pump stage. The second charge pump stage provides the output voltage to an output terminal S2.

A PMOS transistor P1 has a source terminal coupled to the output of the second charge pump stage. The gate terminal of the PMOS transistor P1 receives a logic signal $\overline{A}$(S2). The drain terminal of the PMOS transistor P1 is coupled to the drain terminal of a PMOS transistor P2. The gate terminal of the PMOS transistor P2 receives a logic signal $\overline{A}$(S4). The source terminal of the PMOS transistor P2 is coupled to the output of the fourth charge pump stage. The functions of the PMOS transistors P1 and P2 will be described further below.

A PMOS transistor P3 is coupled between the output of the second charge pump stage and the input of the third charge pump stage. In particular, the source terminal of the PMOS transistor P3 is coupled to the output of the second charge pump stage. A drain terminal of the PMOS transistor P3 is coupled to the input of the third charge pump stage. The gate terminal of the transistor P3 receives the logic signal A(S2). A PMOS transistor P4 is coupled between the input of the third charge pump stage and the supply voltage VDD. The gate terminal of the PMOS transistor P4 receives the logic signal $\overline{A}$(S2), where $\overline{A}$ is the logical complement of the logic value A. The input of the third charge pump stage can receive either the output of the second charge pump stage or the supply voltage VDD based on the value of the logic signals provided to the gate terminals of the transistors P3 and P4.

The output of the fourth charge pump stage is coupled to the output terminal S4, and a source terminal of a PMOS transistor P5. The drain terminal of the PMOS transistor P5 is coupled to the drain terminal of the PMOS transistor P6. The source terminal of the PMOS transistor P6 is coupled to the input of the fifth charge pump stage. The gate terminals of the transistors P5 and P6 each receive the logic signal A+B(S4), where A+B represents the logical OR operation of the logic values A and B.

The input of the fifth charge pump stage is coupled to the supply voltage VDD by the PMOS transistors P7 and P8. The source terminal of the transistor T7 is coupled to the supply voltage VDD. The drain terminals of the transistors P7 and P8 are coupled together. The source terminal of the transistor P8 is coupled to the input of the fifth charge pump stage. The gate terminals of the transistors P7 and P8 receive the logic signal $\overline{A+B}$(S2), where $\overline{A+B}$ is the logical complement of the logical OR operation A+B.

The output of the sixth charge pump stage is coupled to the output terminal S6. Transistors P11 and P12 are coupled between the output of the sixth charge pump stage and the input of the seventh charge pump stage. The gate terminals of the PMOS transistors P11 and P12 receive the logic signal A(S6). The input of the seventh charge pump stage is coupled to the supply voltage VDD by the PMOS transistors P13 and P14. The gate terminals of the transistors P13 and P14 receive the logic signal A(S6). The output of the eighth charge pump stage is coupled to the output terminal S8. The output of the six charge pump stage is coupled to the output of the eighth charge pump stage by the PMOS transistors P9 and P10. The transistor P9 receives the logic signal A(S6) on its gate terminal. The PMOS transistor P10 receives the logic signal A(S8) on its gate terminal.

The output of the fourth charge pump stage is coupled to the output of the eighth charge pump stage by the PMOS transistors P15, P16, and P17. The gate terminal of the transistor P15 receives the logic signal $\overline{A \oplus B}$(S4). The gate terminals of the transistors P16 and P17 receive the logic signal $\overline{A \oplus B}$(S8). Where, $A \oplus B$ represents the exclusive OR operation between logic values A and B. $\overline{A \oplus B}$ is the logical complement of the exclusive nor operation between logic values A and B.

The value in parentheses next to the various logic signals corresponds to a level shifting applied to the logic signals. For example, the logic signal A may have logic values 0 or 1, where 0 is represented by ground and 1 is represented by VDD. A(S2) corresponds to the logic signal A, but level shifted to a voltage level of the output terminal S2. In this case, logical 1 is represented by the voltage supplied to the output terminal S2, while logical 0 is represented by ground. Accordingly, if the output of the second charge stage is 2*VDD, then the logical 1 of A(S2) is 2*VDD.

The level shifting for the various logic signals is performed to ensure that the logic signals can turn the transistors on and off. Typically, in order to turn off a PMOS transistor, a voltage equal to or greater than the voltage on the source terminal is applied to the gate terminal. Accordingly, because the source terminal of the transistor P1 receives the output voltage of the second charge pump stage, in order to turn off the transistor P1, the gate terminal should also receive a voltage value equal to the output voltage of the second charge pump stage. This principle applies to the various transistors of the charge pump 102. The logic signals for the various transistors are level shifted to the highest voltage value to which those transistors are coupled. The transistors P1, P3, and P4 receive logic signals level shifted to the level of the output terminal S2. The transistors P2, P5, P6, P7, P8, and P15 receive logic signals level shifted to the level of the output terminal S4. The transistors P9, P11-P14 receive logic signals level shifted to the level of the output terminal S6. The transistors P10, P16, and P17 receive logic signals level shifted to the level of the output terminal S8.

Figures 3, 4:
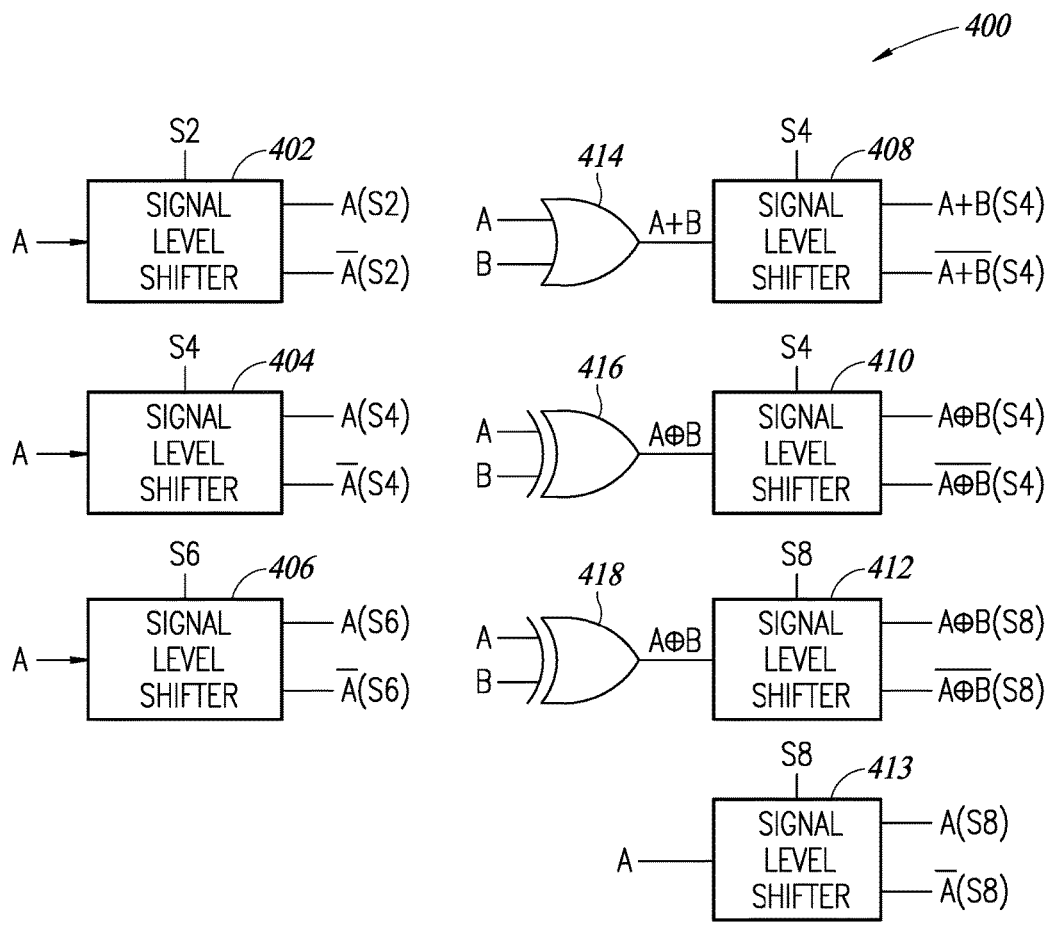
FIG. 3 is a logic chart for selecting charge pump operational modes, according to one embodiment.
FIG. 4 is a block diagram of a level shifter circuit, according to one embodiment.

The operation of the charge pump 102 of FIG. 2 will be described jointly in relation to FIG. 3. FIG. 3 illustrates a logic table 300. The values of A and B correspond to a selection code for implementing a selected operational mode of the charge pump 102. The selection code 00 is represented by A=0 and B=0. The selection code 01 is represented by A=0 and B=1. The selection code 10 is represented by A=1 and B=0. The selection code 11 is not allowed in the example of FIGS. 2 and 3.

The programming mode is represented by the selection code 00. The selection code 00 couples all of the charged pump stages in series. For example, the transistors P1, P2, and P4 each receive the logic signal A=1, level shifted to the value of the output terminal S2. This turns off the transistors P1, P2, and P4. The transistor P3 receives the logic signal A=0, which turns on the transistor P3. Accordingly, the input of the third charge pump stage receives the output of the second charge pump stage.

In the programming mode, the transistor P15 receives the logic signal $\overline{A \oplus B}$=1, level shifted to the value of the output terminal S4, thereby turning off the transistor P15. The transistors P7 and P8 receive the logic signal $\overline{A+B}$=1, level shifted to the level of the output terminal S4, thereby turning off the transistors T7 and P8. The transistors P5 and P6 receive the logic signal A+B=0, thereby turning on the transistors P5 and P6 and coupling the input of the fifth charge pump stage to the output of the fourth charge pump stage.

In the programming mode, the transistors P9, P13, and P14 receive the logic signal $\overline{A}$=1, level shifted to the value of the output terminal S6, thereby turning off the transistors P9, P13, and P14. The transistor The transistors P11 P12 receive the logic signal A=0, thereby turning on the transistors P11 and P12 and coupling the input of the seventh charge pump stage to the output of the sixth charge pump stage. The transistors P16 and P17 receive the logic signal $\overline{A \oplus B}$=1, level shifted to the value of the output terminal S8, thereby turning off the transistors P16 and P17.

The result is that all eight of the charge pump stages are coupled in series. The output terminal S8 provides a programming voltage that can be used to write data to or erase data from the memory cells of the memory array 104. In one example, the supply voltage VDD is 1.8 V. Each charge pump stage adds the value of the supply voltage to the output of the previous charge pump stage. After a charge pump stages coupled in series, the output terminal S8 provides a programming voltage of 16.2 V.

The selection code 10 corresponds to selection of a read operational mode. In the read operational mode, the logic signals result in transistors P3, P5, P6, P11, and P12 being turned off. All other transistors are turned on. The first, third, fifth, and seventh charge pump stages each receive the supply voltage VDD. Because the transistors P1, P2, P9, P10, and P15-P17 are turned on, the output terminals S2, S4, S6, and S8 are coupled together. The result is four parallel groups of two series coupled charge pump stages. The first group includes the first and second charge pump stages coupled in series, the second group includes the third and fourth charge pump stages coupled in series, the third group includes the fifth and sixth charge pump stages coupled in series, and the fourth group includes the seventh and eighth charge pump stages coupled in series. In an example in which the supply voltage VDD is 1.8 V, each group outputs 5.4 V for a read operation. Because there are four groups of charge pumps coupled in series, the charge pump 102 is able to output a relatively high current for read operations.

The selection code 01 corresponds to a test operational mode. In the test operational mode, the logic signals turn off the transistors P1, P2, P4-P6, P9, P10, P13, and P14. The logic signals turn on the transistors P3, P7, P8, P11, P12, and P15-P16. This results in two parallel groups of four series coupled charge pump stages. A first group includes charge pump stages one through four. A second group includes charge pump stages five through eight. Because the transistors P15-P17 are turned on, output terminals S4 and S8 are coupled together. In an example in which the supply voltage VDD equals 1.8 V, the output of each group of four series coupled charge pump stages is 9 V.

While particular examples have been given in relation to FIGS. 2 and 3, other configurations of charge pump stages, switches, and voltage values can be utilized without departing from the scope of the present disclosure.

FIG. 4 is a schematic diagram of level shifting and logic circuitry 400, according to one embodiment. The level shifting and logic circuitry 400 can be part of the mode selector 106. The level shifting and logic circuitry includes a first level shifter 402, a second level shifter 404, a third level shifter 406, a fourth level shifter 408, a fifth level shifter 410, a sixth level shifter 412, and a seventh level shifter 413.

The level shifter 402 receives the output voltage S2 and the logic signal A. The level shifter 402 outputs the logic signals A(S2) and A(S2). The level shifter 404 receives the output voltage S4 and the logic signal A. The level shifter 404 outputs the logic signals A(S4) and A(S4). The level shifter 406 receives the output voltage S6 and the logic signal A. The level shifter 406 outputs the logic signals A(S6) and A(S6). The level shifter 413 receives the output voltage S8 and the logic signal A. The level shifter 413 outputs the logic signals A(S8) and A(S8). The level shifting the logic circuitry 400 includes OR gate 414, XOR gate 416, and XOR gate 418. The OR gate 414 receives the logic signals A and B and outputs the logic signal A+B. The level shifter 408 receives the logic signal A+B and the output voltage S4 and outputs the logic signals A+B(S4) and $\overline{A+B}$(S4). The XOR gate 416 receives the logic signals A and B and outputs the logic signal A⊕B. The level shifter 410 receives the logic signal A⊕B and the output voltage S4 and outputs the logic signals A⊕B(S4) and $\overline{A \oplus B}$(S4). The XOR gate 418 receives the logic signals A and B and outputs the logic signal A⊕B. The level shifter 412 receives the logic signal A⊕B and the output voltage S8 and outputs the logic signals A⊕B(S8) and $\overline{A \oplus B}$(S8). Alternatively, the level shifter 412 can receive the logic signal A⊕B from the XOR gate 416.

Figure 5A:
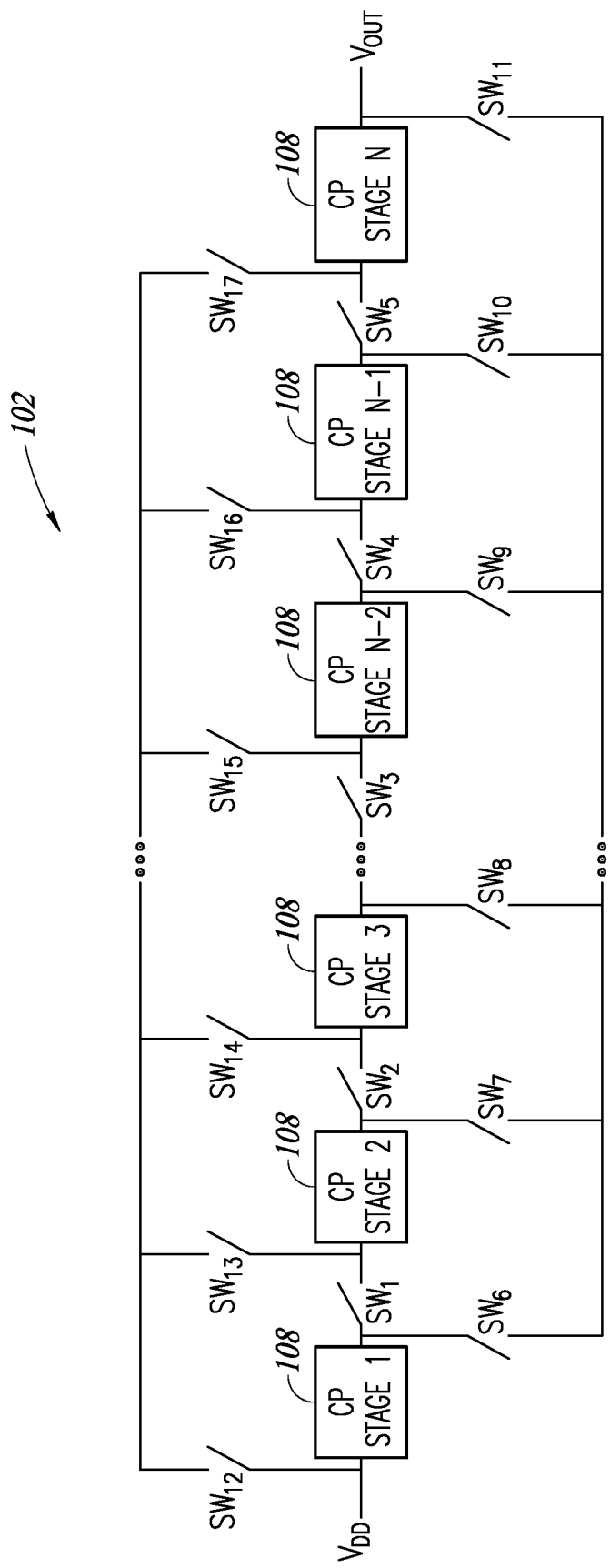
FIGS. 5A-5E are schematic diagrams of a charge pump in various operational configurations, according to one embodiment.

FIG. 5A is a schematic diagram of a charge pump 102, according to one embodiment. The charge pump 102 includes n charge pump stages 108. The charge pump stages 108 can be selectively coupled to generate voltages between 2*VDD and (n+1)*VDD.

The charge pump 102 includes a plurality of switches SWx. FIG. 5A illustrates switches SW1-SW17. However, in practice the charge pump 102 includes additional switches coupling the charge pump stages between charge pump stage 3 and the charge pump stage n−2. Accordingly, the number of switches is based on the number of charge pump stages 108. FIG. 5A illustrates at least six charge pump stages. However, a charge pump 102 in accordance with the principles illustrated in FIG. 5A can include fewer charge pump stages than six. In these cases, the charge pump 102 will have fewer switches than shown in FIG. 5A.

Each switch SWx can include one or more PMOS transistors as illustrated in FIG. 2. With reference to FIG. 2, the transistors P1 and P2 can be considered a switch that can couple the outputs of charge pump stage 2 and charge pump stage 4. The transistor P3 can be considered a switch that couples the output of charge pump stage 2 to the input of charge pump stage 3. The transistors P15-P17 can be considered a switch that couples the output of charge pump stage 4 to the output of charge pump stage 8. Accordingly, FIG. 2 illustrates an example in which switches can include various numbers of PMOS transistors.

Returning to FIG. 5A, each switch SWx of FIG. 5A can include one or more PMOS transistors similar to FIG. 2. The gate terminals of the transistors of the switches SWx of FIG. 5A can receive level shifted voltages as described in relation to FIGS. 2-4. The level shifting can be based on the expected maximum voltage that could appear at the source and drain of the various transistors, as described in relation to FIGS. 2-4.

Other types of transistors can be used for the switches SWx. For example, the switches SWx can include NMOS transistors. Each switch SWx can include one or more NMOS transistors with gate terminals that receive level shifted voltages in accordance with principles described previously. In another example, each switch SWx can include one or more PMOS transistors and one or more NMOS transistors.

In FIG. 5A, switches SW1-SW5 couple the output of a charge pump stage to the input of the next charge pump stage. For example, SW1 can selectively couple the output of charge pump stage 1 to the input of charge pump stage 2. The switches SW1-SW5 can be selectively closed to couple charge pump stages together in series as will be described in further detail below. The SW1-SW5 can be considered series control switches.

In FIG. 5A, switches SW6-SW11 can be utilized to selectively couple the output of a charge pump stage to the output of one or more other charge pump stages. The switches SW6-SW11 are utilized for selectively coupling charge pump stages together in parallel as will be described in further detail below. The switches SW6-SW11 can be considered parallel output control switches.

In FIG. 5A, switches SW12-SW17 can be utilized to selectively couple the input of a charge pump stage to the input of one or more other charge pump stages. The switches SW12-SW17 are utilized for selectively coupling charge pump stages together in parallel as will be described in further detail below. The switches SW12-SW17 can be considered parallel input control switches.

In one embodiment, VDD can be provided to inputs of the charge pump stages 2-$n$ via switches other than the parallel input control switches SW12-SW17. Accordingly, the input of the charge pump stages can be coupled to VDD via dedicated VDD control switches separate from the parallel input control switches. Various other schemes for implementing series and parallel couplings can be utilized without departing from the scope of the present disclosure.

In the view of FIG. 5A all of the switches SWx are open such that none of the charge pump stages are electrically coupled to each other. The switches SWx can be selectively closed to electrically couple the charge pump stages in various series and parallel arrangements. A mode selector 106 (see FIG. 1) can be utilized to select the desired output voltage of the charge pump 102 and the corresponding opening and closing of each switch SWx.

Figure 5B:
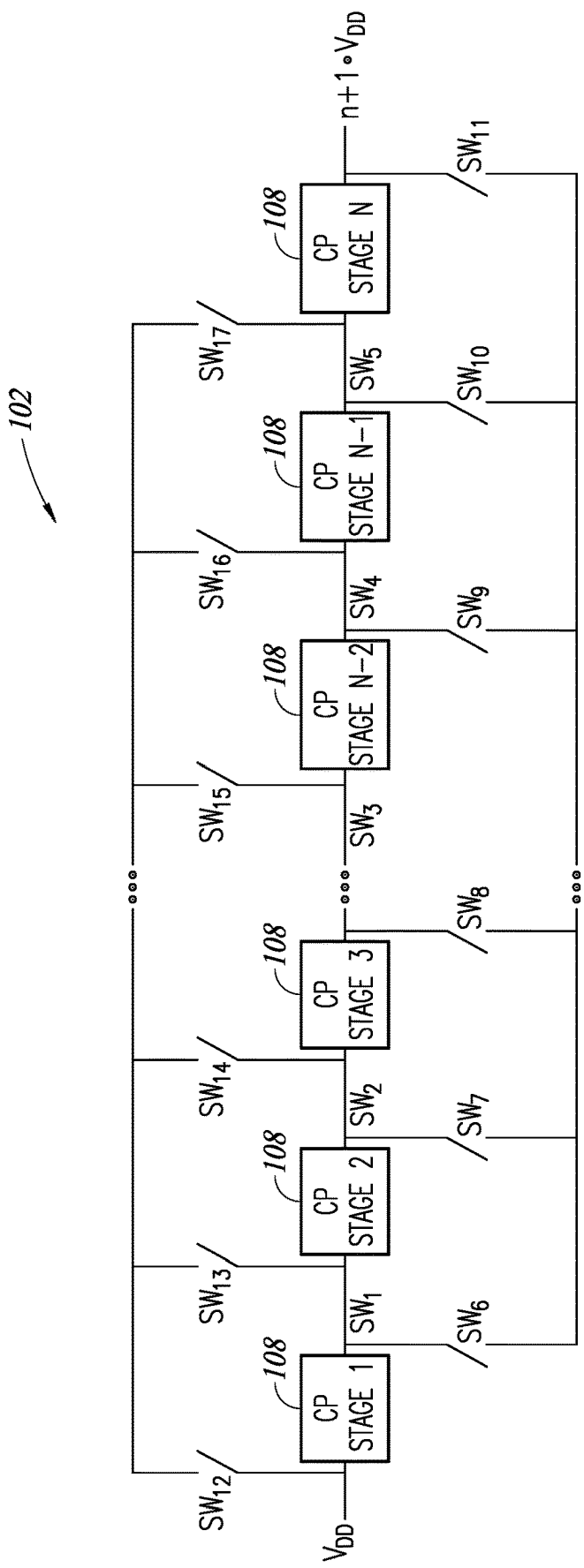

FIG. 5B is a schematic diagram of the charge pump 102 of FIG. 5A in a particular operational mode, according to one embodiment. In FIG. 5B, the output voltage is (n+1)*VDD. The switches SW1-SW5 are all closed, thereby coupling each of the n charge pump stages 108 in series. The switches SW6-SW17 are all open, thereby ensuring that no charge pump stages are coupled in parallel.

Figure 5C:
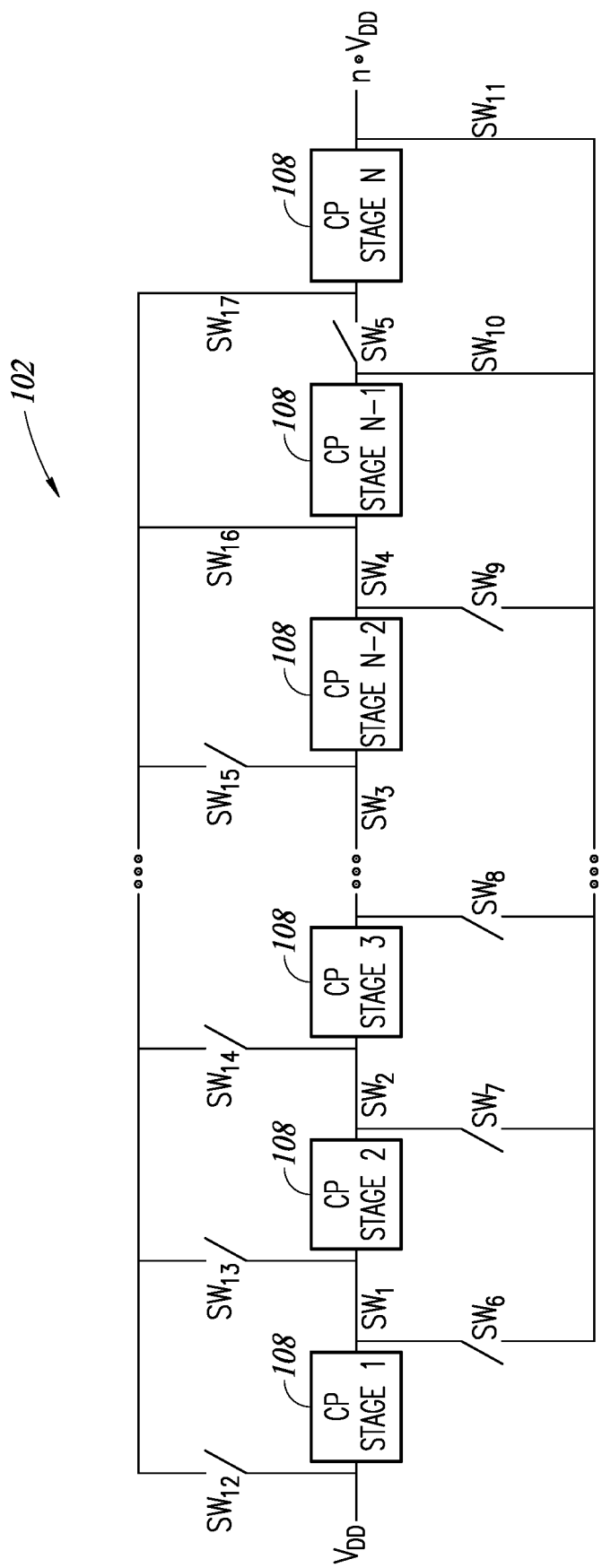

FIG. 5C is a schematic diagram of the charge pump 102 of FIG. 5A in a particular operational mode, according to one embodiment. In FIG. 5C, the output voltage of the charge pump 102 is n*VDD. In FIG. 5C the series control switches SW1-SW4 are closed, thereby coupling charge pump stages 1 through n−1 in series. Series control switch SW5 is open, thereby ensuring that charge pump stage n−1 and charge pump stage n are not coupled in series. Parallel output control switches SW6-SW9 and parallel input control switches SW12-SW15 are open, thereby ensuring no parallel connections between charge pump stages SW1-SWn−1. Parallel output control switches SW10 and SW11 and parallel input control switches SW16 and SW17 are closed, thereby ensuring that charge pump stage n−1 and the charge pump stage n are coupled in parallel. The resulting output voltage of the charge pump 102 is n*VDD. The parallel connection of charge pump stages n−1 and n results in an increased amount of current at the voltage n*VDD than would be possible if none of the stages are coupled in parallel.

Figure 5D:
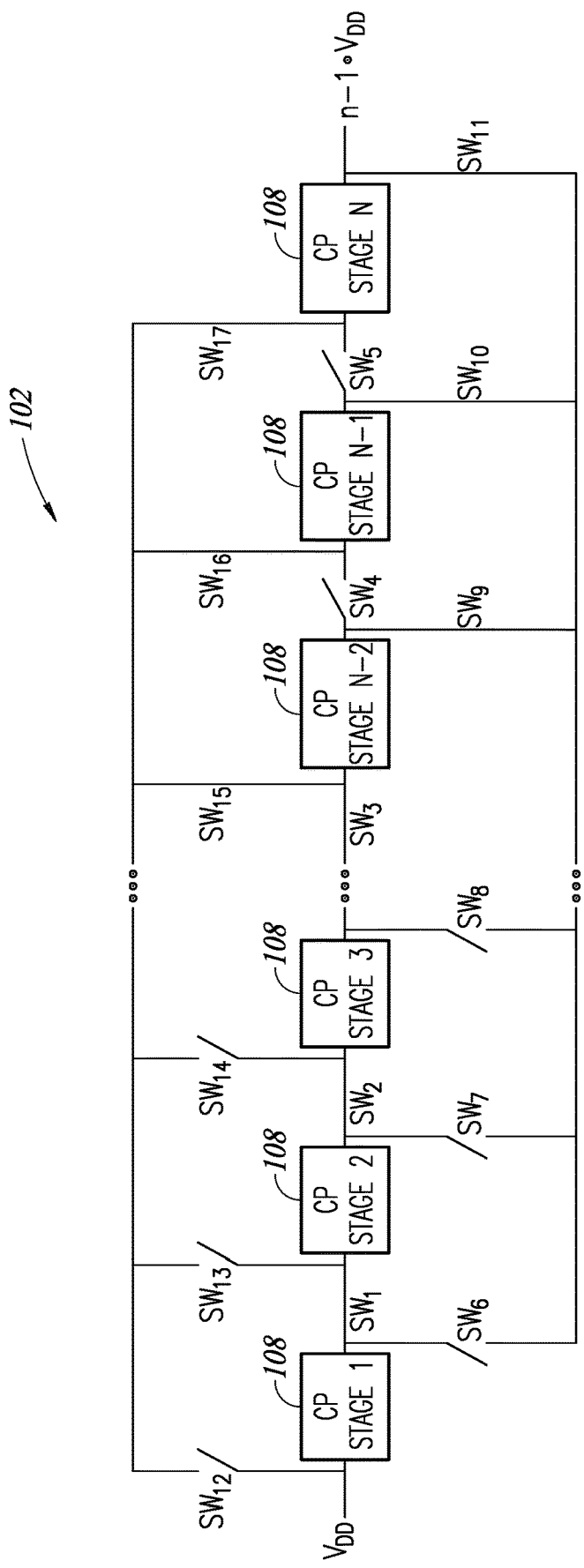

FIG. 5D is a schematic diagram of the charge pump 102 of FIG. 5A in a particular operational mode, according to one embodiment. In FIG. 5D, the output voltage of the charge pump 102 is (n−1)*VDD. In FIG. 5D the series control switches SW1-SW3 are closed, thereby coupling the charge pump stage 1 through charge pump stage n−1 in series. Series control switches SW4 and SW5 are open, thereby ensuring that charge pump stages n−2 through n are not coupled in series. Parallel output control switches SW6-SW8 and parallel input control switches SW12-SW14 are open, thereby ensuring no parallel connections between charge pump stages SW1-SWn−2. Parallel output control switches SW9-SW11 and parallel input control switches SW15-SW17 are closed, thereby ensuring that charge pump stage n−2 and charge pump stage n are coupled in parallel. The resulting output voltage of the charge pump 102 is (n−1)*VDD. The parallel connection of charge pump stages n−2, n−1, and n results in an increased amount of current at the voltage (n−1)*VDD than would be possible if none of the stages were coupled in parallel.

Figure 5E:
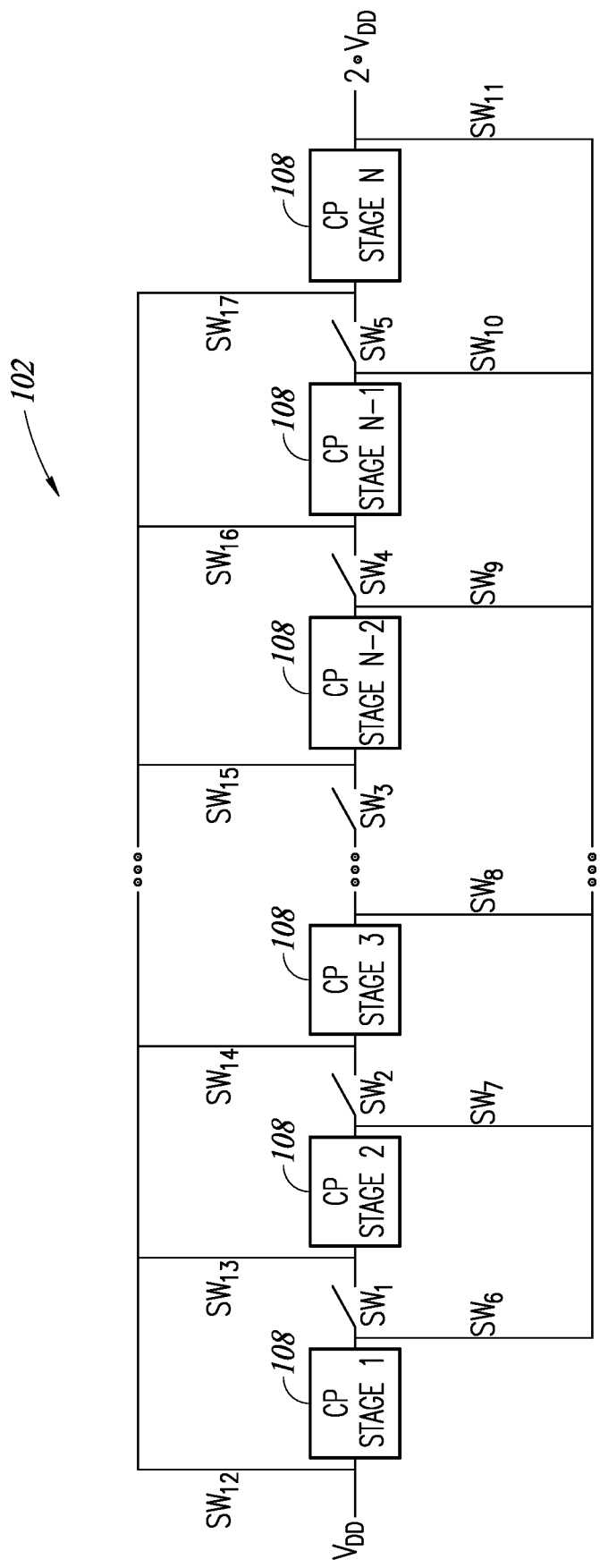

FIG. 5E is a schematic diagram of the charge pump 102 of FIG. 5A in a particular operational mode, according to one embodiment. In FIG. 5E, the output voltage of the charge pump 102 is 2*VDD. All of the series control switches SW1-SW5 are open, thereby ensuring that none of the charge pump stages are coupled in series. All of the parallel output control switches SW6-SW11 and all of the parallel input control switches SW12-SW17 are closed, thereby ensuring that all of the charge pump stages are coupled in parallel. Accordingly, each charge pump stage receives VDD at its input and outputs 2*VDD at its output. The result is that the output voltage of the charge pump 102 is 2*VDD with a very high possible current output because all n charge pump stages are coupled in parallel.

Many other configurations of the charge pump 102 of FIGS. 5A-5E are possible. For example, the various switches SWx can be selectively operated to couple parallel groups of series coupled charge pump stages. Other configurations can be implemented than are shown in the specific examples without departing from the scope of the present disclosure.

Figure 6:
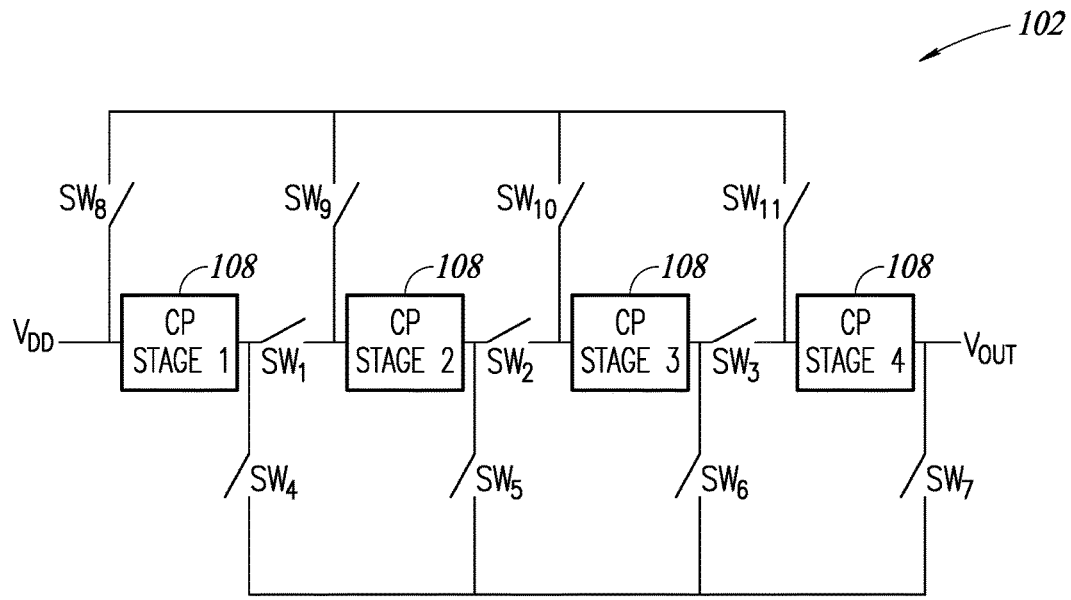
FIG. 6 is a schematic diagram of a charge pump, according to one embodiment.

FIG. 6 is a schematic diagram of a charge pump 102, according to one embodiment. The charge pump 102 includes four charge pump stages 108. The charge pump 102 includes series control switches SW1-SW4 that can be selectively opened or closed to couple charge pump stages in series. The charge pump 102 includes parallel output control switches SW4-SW7 and parallel input control switches SW8-SW11 that can be selectively opened or closed to couple charge pump stages in parallel. The switches SW1-SW11 can receive level shifted voltages as described previously.

In one example, the series control switches SW1-SW4 can be closed to couple all four of the charge pump stages 108 series. The switches SW5-SW11 are open to ensure that there are no parallel connections. In this example, the output of the charge pump 102 is 5*VDD.

In one example, the charge pump 102 can be operated to output 4*VDD. In this example, series control switches SW1 and SW2 are closed, thereby coupling the charge pump stages 1-3 in series. Parallel input control switches SW6 and SW7 and parallel input control switches SW10 and SW11 can be closed in order to couple charge pump stages 3 and 4 in parallel. Switches SW4, SW5, SW8, and SW9 are open in this example.

In one example, the charge pump 102 can be operated to output 3*VDD. In this example, series control switches SW1 and SW3 are closed while series control switch SW2 is open, thereby coupling the first and second charge pump stages in series and the third and fourth charge pump stages in series. In this example, parallel input control switches SW8 and SW10 are closed so that the input of the first charge pump stage is coupled to the input of the third charge pump stage. Parallel output control switches SW5 and SW7 are closed so that the output of the second charge pump stages coupled to the output of the fourth charge pump stage. The remaining switches are open. The result is two parallel groups of two series coupled charge pump stages. The first group includes the first and second charge pump stages coupled in series. The second group includes the third and fourth charge pump stages coupled in series. The first and second groups are coupled in parallel.

In one example, the charge pump 102 can be operated to output 2*VDD. In this case, each of the charge pump stages coupled in parallel. All of the parallel input control switches SW8-SW11 are closed so that the input of each charge pump stage receives VDD. All of the parallel output control switches SW4-SW7 are closed so that the output of each charge pump stage is coupled to the output of the charge pump 102. All of the series control switches SW1-SW3 are open.

Figure 7:
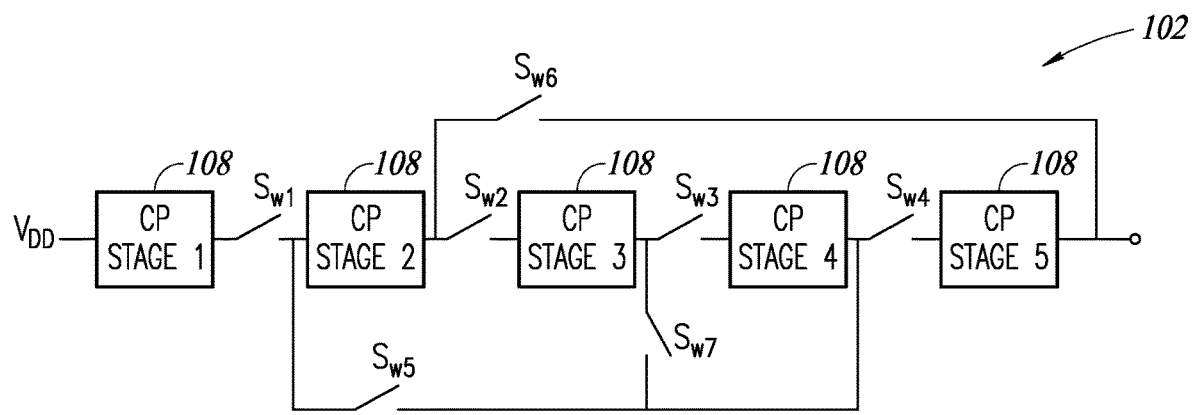
FIG. 7 is a schematic diagram of a charge pump, according to one embodiment.

FIG. 7 is a schematic diagram of a charge pump 102, according to one embodiment. The charge pump 102 includes five charge pump stages 108. The charge pump 102 of FIG. 7 to output 6*VDD or 3*VDD. The charge pump 102 includes series control switches SW1-SW4, parallel input control switches SW5 and SW7, and parallel output control switch SW6.

In one example, the charge pump 102 can be operated to output 6*VDD. In this case, all of the series control switches SW1-SW4 are closed while the parallel control switches SW5-SW7 are open. The result is that all of the charge pump stages are coupled in series.

In one example, the charge pump 102 can be operated to output 3*VDD. In this case, series control switches SW1 and SW3 are closed and series control switches SW2 and SW4 are opened. Parallel control switches SW5 and SW6 are closed. Parallel control switch SW7 is open. The result is to groups of charge funds coupled in parallel. The first group includes charge pump stages 1, 2, and 5. Charge pump stages 2 and 5 are coupled in parallel and the input of each is coupled to the output of charge pump stage 1. The second group includes charge pump stages 3 and 4 coupled in series to each other. Groups 1 and 2 are coupled in parallel.

Figure 8A:
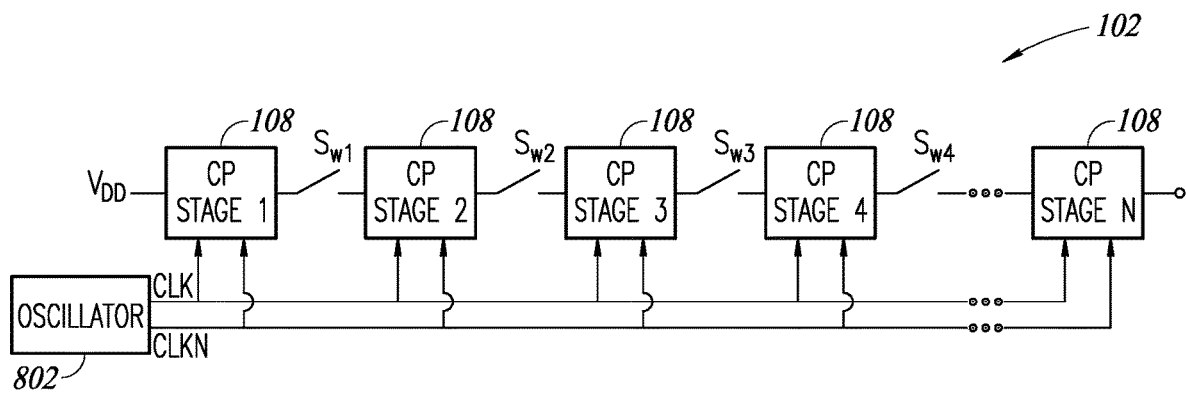
FIG. 8A is a schematic diagram of a charge pump, according to one embodiment.

FIG. 8A is a schematic diagram of a charge pump 102, according to one embodiment. The charge pump 102 includes n charge pump stages that can be selectively coupled by switches SW1-SW4. Though not shown in FIG. 8A, additional parallel control switches can be included so that the charge pump stages can be selectively coupled in various parallel in series connections as described previously. The charge pump 102 includes an oscillator 802. The oscillator 802 outputs a clock signal CLK and complementary clock signal CLKN to each charge pump stage 108. The complementary clock signal CLKN has the same frequency and period as CLK, but is the logical complement of CLK.

The clock signals CLK and CLKN control internal switches and charge internal capacitors of each charge pump stage 108. Each charge pump stage 108 generates an amplified output voltage by selectively connecting and disconnecting capacitors between the input and the output of the charge pump stage 108. The frequency of the clock signal determines, in part, the magnitude of the current that can be supplied from the charge pump stage 108. Higher frequencies result in higher output currents. Lower frequencies result in lower output currents.

In FIG. 8A, the oscillator 802 can be selectively controlled to provide higher or lower frequencies in order to provide higher or lower output currents. In some cases it may be desirable to reduce the amount of power consumed by the charge pump 102. In these cases, the frequency of the clock signals CLK and CLKN can be reduced in order to reduce the total output current. In other cases, it may be desirable to provide a higher output current. In these cases, the frequency of the clock signals CLK and CLKN can be increased in order to increase the total output current. Though not shown in FIG. 8A, control circuitry can be provided to control the oscillator 802 and select the frequency of the clock signals CLK and CLKN provided to the charge pump stages 108.

Figure 8B:
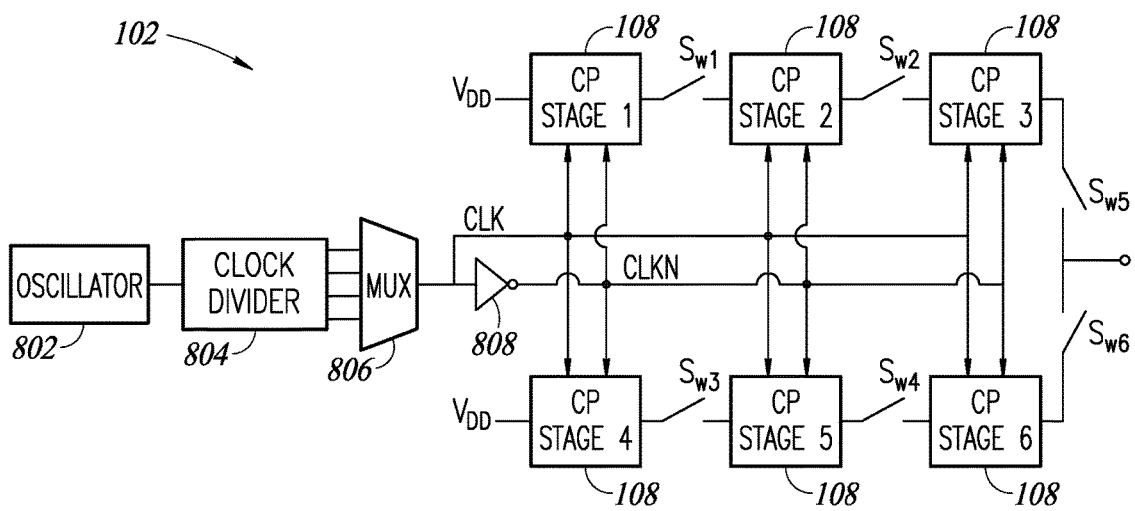
FIG. 8B is a schematic diagram of a charge pump, according to one embodiment.

FIG. 8B is a schematic diagram of a charge pump 102. The charge pump 102 includes six charge pump stages. Charge pump stages 1-3 are coupled in series. Charge pump stages 4-6 are coupled in series with each other. The group of charge pump stages 1-3 is coupled in parallel to the group of charge pump stages 4-6. The charge pump 102 includes switches SW1-SW6, though other switches may also be present to enable selective coupling of charge pump stages in various series and parallel arrangements.

The charge pump 102 includes an oscillator 802, a clock divider 804, and a multiplexer 806. The oscillator 802 provides a clock signal to the clock divider 804. The clock divider 804 receives the clock signal and generates a plurality of clock signals with different frequencies based on the output of the oscillator 802. The clock divider 804 provides the various clock signals to the multiplexer 806. The multiplexer 806 outputs one of the clock signals CLK to each of the charge pump stages 108. An inverter 808 also receives the clock signal CLK and outputs a complementary clock signal CLKN to each of the charge pump stages 108.

As described previously, it may be desirable to reduce or increase the magnitude of the current that can be supplied by the charge pump 102. This can be accomplished by increasing or decreasing the frequency of the clock signals CLK and CLKN provided to the charge pump stages 108. Accordingly, the multiplexer 806 receives the control signal that selects one of the clock signals from the clock divider 804 to be provided to the charge pump stages 108. A lower frequency clock signal can be selected to provide lower output currents. A higher frequency clock signal can be selected to provide higher output currents.

Figure 9A:
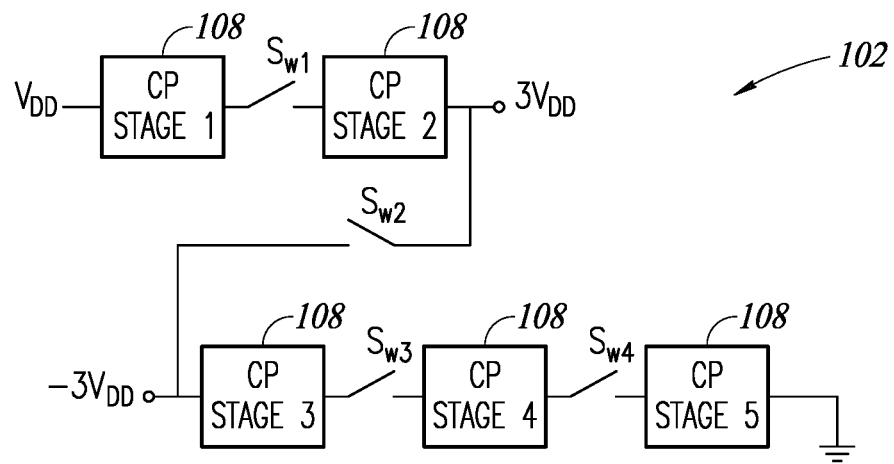
FIG. 9A is a schematic diagram of a charge pump, according to one embodiment.

FIG. 9A is a schematic diagram of a charge pump 102, according to one embodiment. The charge pump 102 is capable of outputting both positive and negative voltages. The charge pump 102 includes switches SW1-SW4 that couple the various charge pump stages. Other switches may be present in order to enable selective coupling of the charge pump stages in various series and parallel connections.

Charge pump stages 1 and 2 can be utilized to provide a positive output voltage 3*VDD. Charge pump stages 3-5 can be utilized to provide a negative output voltage −3*VDD. Charge pump stages 1 and 2 operate substantially as described previously in that the first charge pump stage receives VDD as an input voltage and supplies an output voltage of 2*VDD to the second charge pump stage. The second charge pump stage outputs a positive output voltage of 3*VDD.

Charge pump stages 3, 4, and 5 can be utilized to provide a negative output voltage −3*VDD. Charge pump stage 5 receives, as an input voltage, ground and outputs an output voltage of −VDD. Charge pump stage 4 receives, as an input voltage, −VDD from charge pump stage 5 and outputs an output voltage of −2*VDD. Charge pump stage 3 receives, as an input voltage, −2*VDD from charge pump stage 4 and outputs an output voltage of −3*VDD.

The switches SW3 and SW4 can receive level shifted voltages negative voltage values. The integrated circuit 100 can include level shifters that generate the negative level shifted voltages in the same manner as positive level shifted voltages described previously.

In one embodiment, a charge pump 102 can include n charge pump stages and can selectively generate various negative output voltage between −VDD and −n*VDD. For example, a negative charge pump 102 can include the same type of series control switches, parallel input control switches, and parallel output control switches shown and described in relation to FIGS. 5A-5D, except that the input of the negative charge pump 102 is ground and the output is a negative voltage between −VDD and −n*VDD. The switches can be operated to provide various series and parallel connections to output a selected negative output voltage.

Figure 9B:
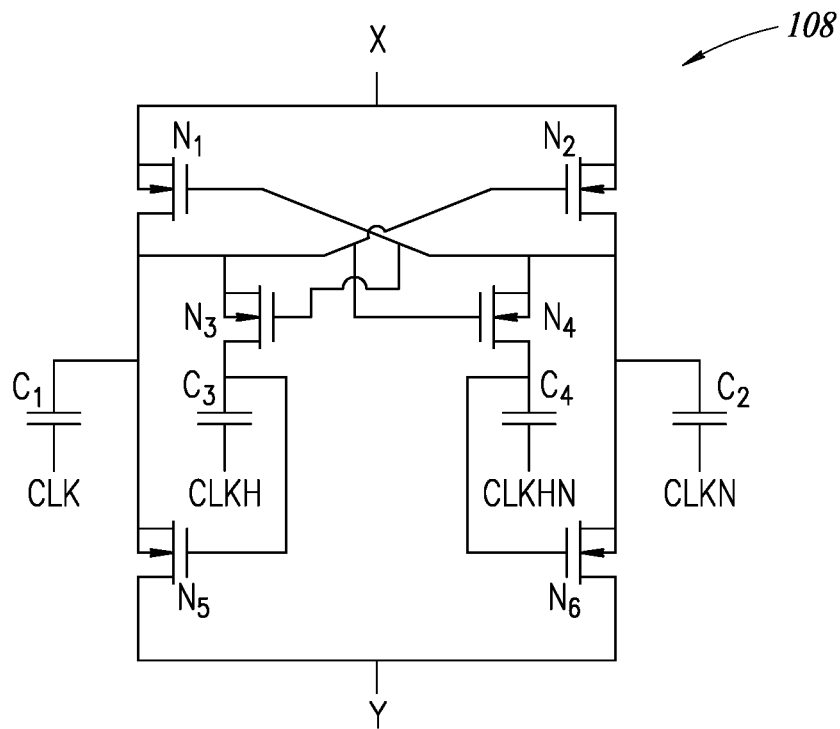
FIG. 9B is a schematic diagram of a charge pump stage, according to one embodiment.

FIG. 9B is a schematic diagram of a charge pump stage 108, according to one embodiment. The charge pump stage 108 includes a terminal X and a terminal Y. In the example of a positive charge pump stage, terminal X receives an input voltage and the charge pump stage 108 outputs at terminal Y an output voltage that is the input voltage plus VDD. In the example of a negative charge pump stage, the terminal Y receives an input voltage and the charge pump stage 108 outputs at terminal X an output voltage that is the input voltage minus VDD.

The charge pump stage 108 includes six NMOS transistors N1-N6. The charge pump stage 108 includes capacitors C1-C4. A first terminal of the capacitor C1 receives the clock signal CLK. The clock signal CLK has an amplitude of VDD. A first terminal of the capacitor C2 receives the complementary clock signal CLKN, also with an amplitude of VDD. The source terminals of N1 and N2 are coupled to the terminal X. The drain of N2 is coupled to the gate of N1. The drain of N1 is coupled to the gate of N2. The source of N3 is coupled to the gate of N2. The source of N4 is coupled to the gate of N1. The gate of N4 is coupled to the source of N3. The gate of N3 is coupled to the source of N4. The capacitor N3 is coupled between the drain of N3 and the signal CLKH. The capacitor N4 is coupled between the drain of N4 and the signal CLKHN. The source of N5 is coupled to the source of N3 and the second terminal of the capacitor C1. The source of N6 is coupled to the source of N4 and the second terminal of the capacitor C2. The drain terminals of N5 and N6 are coupled to the terminal Y. The clock signals CLK and CLKN drive the charge pump stage 108.

Figure 10:
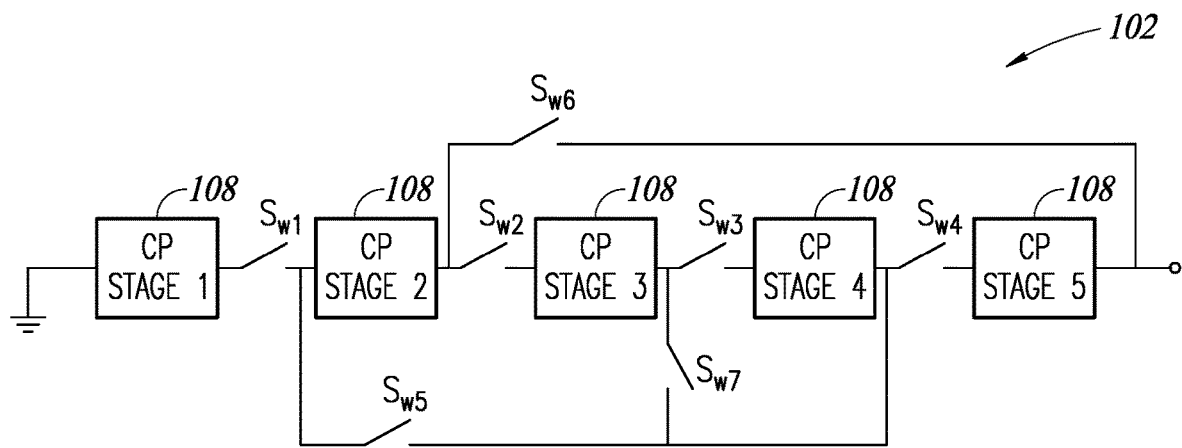
FIG. 10 is a schematic diagram of a charge pump, according to one embodiment.

FIG. 10 is a schematic diagram of a charge pump 102, according to one embodiment. The charge pump 102 includes five charge pump stages 108. The charge pump 102 of FIG. 7 is configured to output a negative voltage of −5*VDD or −2*VDD. The charge pump 102 includes series control switches SW1-SW4, parallel input control switches SW5 and SW7, and parallel output control switch SW6.

In one example, the charge pump 102 can be operated to output −5*VDD. In this case, all of the series control switches SW1-SW4 are closed while the parallel control switches SW5-SW7 are open. The result is that all of the charge pump stages are coupled in series. Charge pump stage 1 receives ground as an input voltage. Charge pump stage 102 outputs −5VDD as the output of the charge pump 102.

In one example, the charge pump 102 can be operated to output −2*VDD. In this case, series control switches SW1 and SW3 are closed and series control switches SW2 and SW4 are opened. Parallel control switches SW5 and SW6 are closed. Parallel control switch SW7 is open. The result is two groups of charge pumps coupled in parallel. The first group includes charge pump stages 1, 2, and 5. Charge pump stages 2 and 5 are coupled in parallel and the input of each is coupled to the output of charge pump stage 1. The second group includes charge pump stages 3 and 4 coupled in series to each other. Groups 1 and 2 are coupled in parallel.

Figure 11:
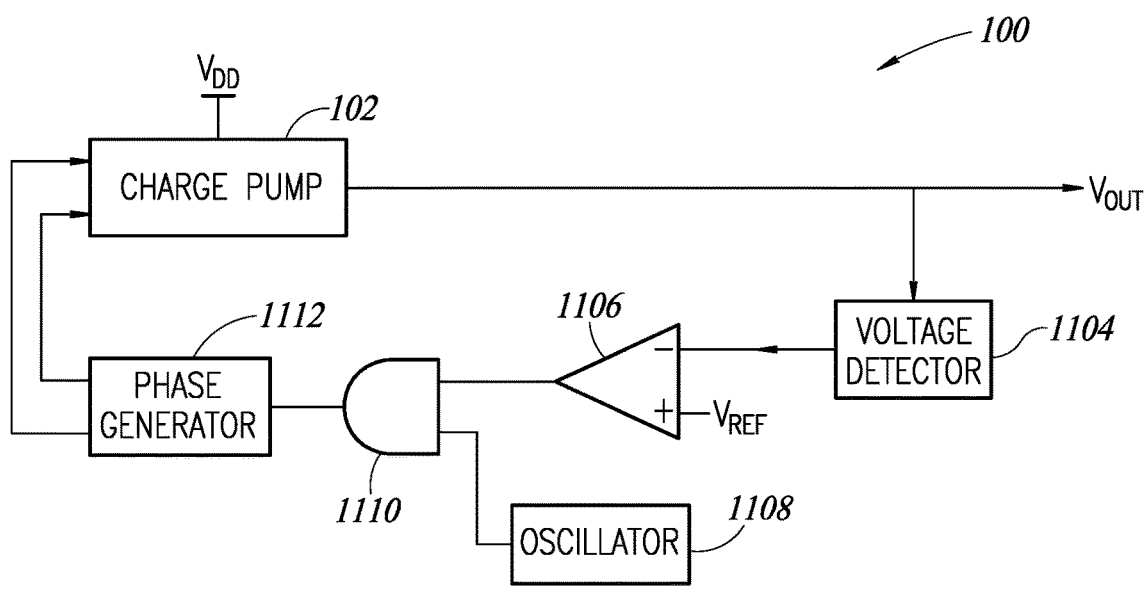
FIG. 11 is a block diagram of an integrated circuit, according to one embodiment.

FIG. 11 is a schematic diagram of an integrated circuit 100, according to one embodiment. The integrated circuit 100 includes a charge pump 102. The charge pump 102 is configured to generate an amplified voltage based on an input voltage as described previously in relation to FIGS. 1-10.

The integrated circuit 100 includes a voltage detector 1104, a comparator 1106, an oscillator 1108, an AND gate 1110, and a phase generator 1112. The voltage detector 1104 receives the output voltage from the charge pump 102. The voltage detector outputs a divided voltage to the comparator 1106. The divided voltage is based on the output voltage in accordance with a selected ratio.

The comparator 1106 compares the output of the voltage detector 104 to a reference voltage Vref. If the output of the voltage detector 104 is higher than the reference voltage, then the comparator 1106 outputs a low logic signal. The oscillator 1108 outputs a clock signal to the AND gate 1110. The AND gate outputs a low logic signal if either the output of the comparator 1106 is low or the output of the oscillator 1108 is low.

The phase generator 1112 receives the output of the AND gate 1110. The phase generator 1112 outputs a clock signal to the charge pump 102 based on the output of the AND gate 1110. The clock signal provided by the phase generator 1112 is based on the output of the AND gate 1110.

In one embodiment, the phase generator 1112 does not supply the clock signal while the output of the AND gate 1110 is low. In this case, the output voltage of the charge pump 102 will gradually decrease. Accordingly, if the output voltage of the charge pump 102 is too high, then the comparator 1106 will output a low logic signal, thereby causing the comparator 1110 to output a low logic signal.

This in turn causes the phase generator 112 to not output an oscillating signal to the charge pump 102. If the output voltage of the charge pump 102 is not too high, then the comparator 1106 outputs a high logic signal. The output of the AND gate 1110 will then oscillate in accordance with the frequency of the clock signal provided by the oscillator 1108. The phase generator 1110 will likewise output a clock signal and a complementary clock signal to the charge pump 102 causing the charge pump 102 to operate normally.

Thus, the integrated circuit 100 includes a feedback loop that can control the output voltage of the charge pump 102. The voltage detector 1104, the comparator 1106, the oscillator 1108, the AND gate 1110, and the phase generator 1112 cooperate to regulate the output voltage of the charge pump 102 as set forth above.

Figure 12:
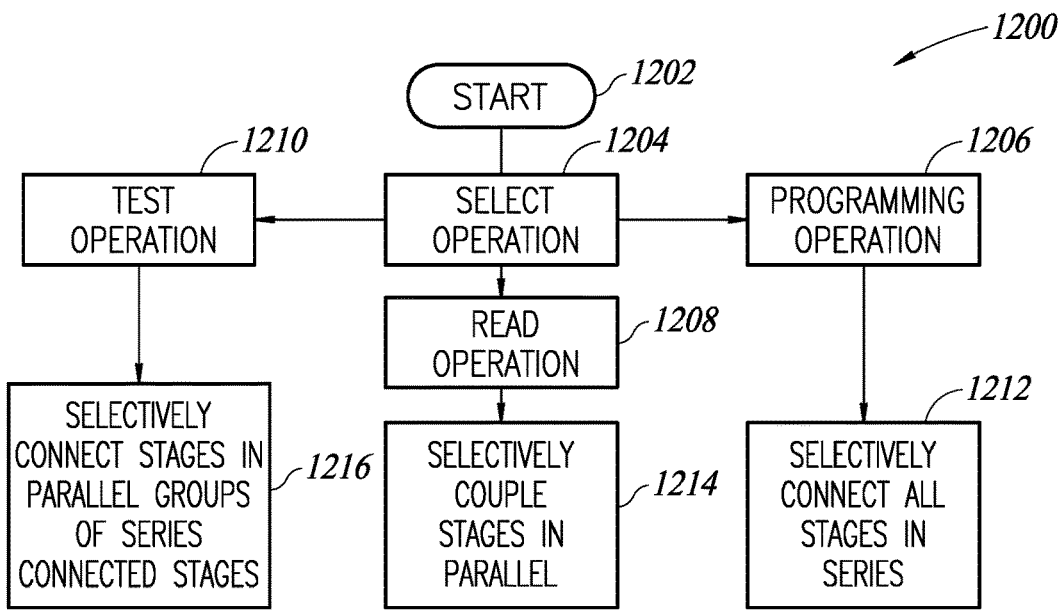
FIG. 12 is a flow diagram of a process for operating a charge pump, according to one embodiment.

FIG. 12 is a flow diagram of a method 1200 for operating a charge pump, according to one embodiment. At 1202, the method 1200 starts. At 1204, an operational mode is selected. The operational mode can be selected by the mode selector 106 or by another circuit. At 1206, a programming operation is selected. The programming operation can correspond to a right or a race operation of memory cells of the memory array. At 1212, the charge pump 102 selectively couples all charge pump stages in series to generate a high voltage for a programming operation.

At 1208 a read operation is selected. At 1214, the charge pump 102 selectively couples charge pump stages in parallel. In the example of FIG. 2, the charge pump 102 includes four groups of two series coupled charge pump stages. In one example, each group of two series coupled charge pump stages can be considered a single charge pump stage because they are hardwired together. In this case, a 1214 the charge pump 102 can be considered to couple all charge pump stages in parallel for the read operation. Alternatively, the charge pump 102 can be considered to couple the charge pump stages into four parallel groups of two series coupled charge pump stages.

At 1210 a test operational mode is selected. At 1216, the charge pump 102 selectively couples the charge pump stages into two parallel groups of four series coupled charge pump stages. If the charge pump 102 includes a different number of charge pump stages than shown in FIG. 2, then in the test mode, there may be different numbers of parallel coupled groups having different numbers of series coupled charge pump stages.

Figure 13:
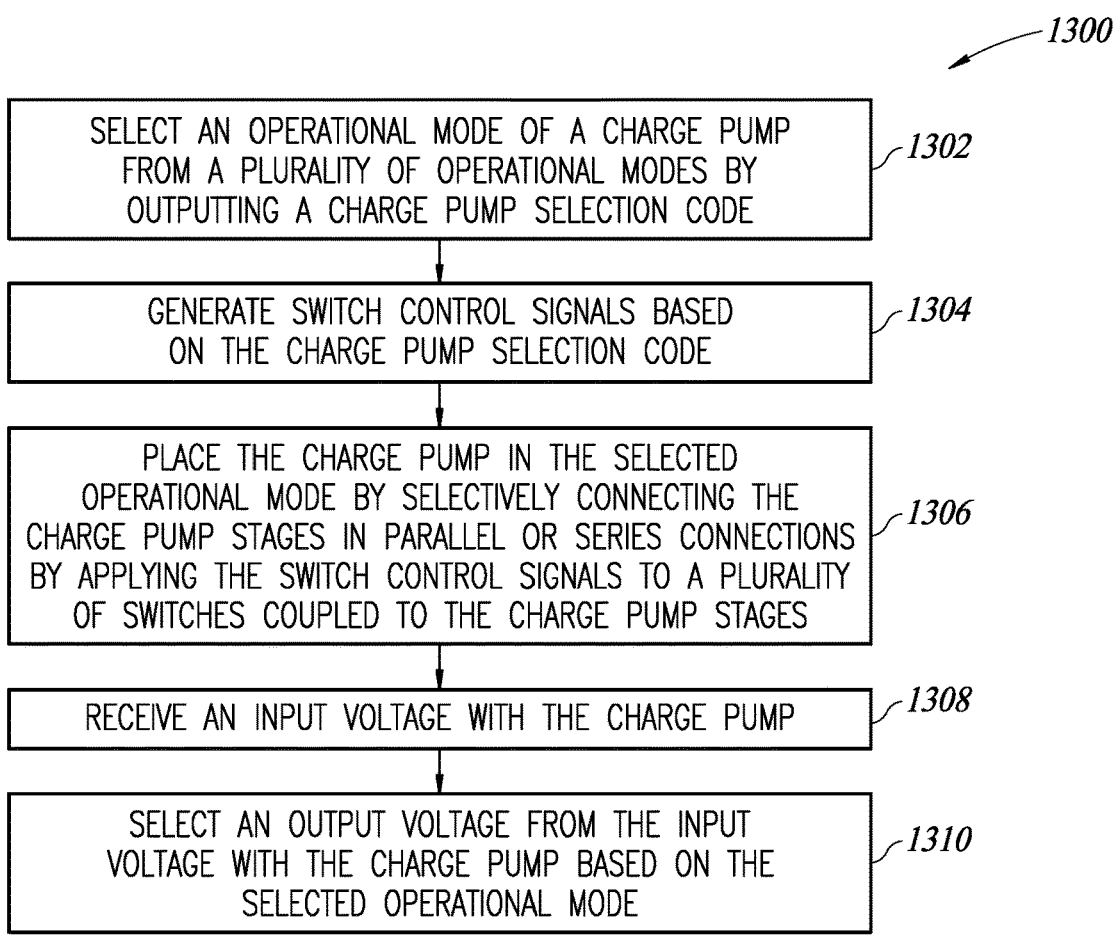
FIG. 13 is a flow diagram of a process for operating a charge pump, according to one embodiment.

FIG. 13 is a flow diagram of a method for operating a charge pump, according to one embodiment. At 1302, the method 1300 includes selecting an operational mode of the charge pump from a plurality of operational modes by outputting a charge pump selection code. At 1304, the method 1300 includes generating switch control signals based on the charge pump selection code. At 1306, the method 1300 includes placing the charge pump in a selected operational mode by selectively coupling the charge pump stages in parallel or serious connections by applying the switch control signals to a plurality of switches coupled to the charge pump stages. At 1308, the method 1300 includes receiving an input voltage with the charge pump. At 1310, the method 1300 includes generating an output voltage from the input voltage with the charge pump based on the selected operational mode.

One embodiment is an integrated circuit including a memory array having a plurality of memory cells. The integrated circuit includes a mode selector coupled to the memory cells and configured to output a charge pump mode selection code to select a charge pump operating mode from a plurality of charge pump operating modes. The integrated circuit includes a logic circuit coupled to the mode selector and configured to receive the charge pump mode selection code and to output switch control signals based on the charge pump mode selection code. The integrated circuit includes a charge pump coupled to the memory array and including a plurality of charge pump stages. The integrated circuit includes a plurality of switches configured to receive the switch control signals from the logic circuit and to selectively couple the charge pump stages in series, in parallel, and in parallel groups of series coupled charge pump stages based on the switch control signals.

An integrated circuit can include a memory array and a charge pump coupled to the memory array and including a plurality of charge pump stages and configured to selectively couple all of the charge pump stages in series for a programming operation of the memory array and to couple the charge pump stages in a first number of parallel groups of series coupled charge pump stages for a read operation of the memory array. The integrated circuit can include a mode selector coupled to the charge pump and configured to output a selection code to cause the charge pump to couple the charge pump stages for either the read operation or the programming operation.

A method includes selecting an operational mode of a charge pump from a plurality of operational modes by outputting a charge pump selection code and generating switch control signals based on the charge pump selection code. The method includes activating the selected operational mode of the charge pump by selectively coupling the charge pump stages in parallel or series connections by applying the switch control signals to a plurality of switches coupled to the charge pump stages. The method includes receiving an input voltage with the charge pump and generating an output voltage from the input voltage with the charge pump based on the selected operational mode.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. An integrated circuit, comprising:
 a memory array including a plurality of memory cells;
 a mode selector coupled to the memory cells and configured to output a mode selection code to select a charge pump operating mode from a plurality of charge pump operating modes;
 a logic circuit coupled to the mode selector and configured to receive the mode selection code and to output switch control signals based on the charge pump mode selection code;
 a charge pump coupled to the memory array and including a plurality of charge pump stages; and
 a plurality of switches configured to receive the switch control signals from the logic circuit and to selectively couple the charge pump stages in series, in parallel, and in parallel groups of series coupled charge pump stages based on the switch control signals, wherein the logic circuit includes a plurality of level shifters each coupled to an output of a respective charge pump stage and configured to receive at least a portion of the selection code and to shift the at least a portion of the selection code to a level of the respective charge pump stage.

2. The integrated circuit of claim 1 wherein each charge pump stage includes multiple charge pump sub-stages fixedly coupled in series.

3. The integrated circuit of claim 2 wherein the plurality of charge pump operating modes include a read mode and a programming mode.

4. The integrated circuit of claim 3 wherein in the programming mode, the switch signals couple all of the charge pump stages in series.

5. The integrated circuit of claim 3 wherein in the read mode, the switch control signals couple all of the charge pump stages in parallel.

6. The integrated circuit of claim 3 wherein the plurality of operational modes include a test mode, wherein in the test mode, the switch control signals couple the charge pump stages into multiple parallel groups of series coupled charge pump stages.

7. The integrated circuit of claim 1 wherein the logic circuit outputs, to each switch, switch control signals having a voltage based on a voltage output by the charge pump stage to which the switch is coupled.

8. The integrated circuit of claim 7 wherein the switches include CMOS transistors having gate terminals that receive the switch control signals.

9. An integrated circuit, comprising:
a memory array;
a charge pump coupled to the memory array and including a plurality of charge pump stages and configured to selectively couple all of the charge pump stages in series for a programming operation of the memory array and to couple the charge pump stages in a first number of parallel groups of series coupled charge pump stages for a read operation of the memory array, wherein each charge pump stage incudes multiple charge pump sub-stages fixedly coupled in series; and
a mode selector coupled to the charge pump and configured to output a selection code to cause the charge pump to couple the charge pump stages for either the read operation or the programming operation, wherein in a test mode of the charge pump the selection code couples the charge pump stages into multiple parallel groups of series coupled charge pump stages.

10. The integrated circuit of claim 9, further comprising a plurality of switches configured to couple the charge pump stages for the read operation or the programming operation based on the selection code.

11. The integrated circuit of claim 10 wherein the switches include CMOS transistors.

12. The integrated circuit of claim 9 wherein the charge pump receives an input voltage and generates an output voltage having a magnitude based on whether the read operation or the programming operation is selected.

13. The integrated circuit of claim 12 wherein the output voltage is higher for the programming operation than for the read operation.

14. The integrated circuit of claim 13 wherein the charge pump is configured to selectively couple the charge pump stages in a second number of parallel coupled groups of series coupled charge pump stages for a test operation of the memory cell, wherein the second number is smaller than the first number.

15. A method, comprising:
selecting an operational mode of a charge pump from a plurality of operational modes by outputting a charge pump selection code from a mode selector, the charge pump including a plurality of charge pump stages;
generating with a logic circuit, switch control signals based on the charge pump selection code;
activating the selected operational mode of the charge pump by selectively coupling the charge pump stages in parallel or series connections by applying the switch control signals to a plurality of switches coupled to the charge pump stages;
receiving an input voltage with the charge pump; and
generating an output voltage from the input voltage with the charge pump based on the selected operational mode, wherein the logic circuit includes a plurality of level shifters each coupled to an output of a respective charge pump stage and configured to receive at least a portion of the selection code and to shift the at least a portion of the selection code to a level of the respective charge pump stage.

16. The method of claim 15, further comprising selectively generating, for each switch, a switch control signal having a magnitude based on an output voltage of an adjacent charge pump stage.

17. The method of claim 15, further comprising outputting the output voltage to a memory array for a memory operation corresponding to the operational mode of the charge pump.

18. The method of claim 15 wherein the operational modes include a memory read mode and a memory programming mode.

19. The method of claim 15, comprising adjusting an available output current of charge pump by adjusting a frequency of a clock signal.

* * * * *

UNITED STATES PATENT AND TRADEMARK OFFICE
CERTIFICATE OF CORRECTION

| | |
|---|---|
| PATENT NO. | : 11,908,528 B2 |
| APPLICATION NO. | : 17/527031 |
| DATED | : February 20, 2024 |
| INVENTOR(S) | : Vikas Rana et al. |

It is certified that error appears in the above-identified patent and that said Letters Patent is hereby corrected as shown below:

In the Claims

<u>Column 18, Claim 15, Line 20:</u>
"generating with a logic circuit," should read: --generating, with a logic circuit,--.

Signed and Sealed this
Sixteenth Day of April, 2024

Katherine Kelly Vidal
*Director of the United States Patent and Trademark Office*